US009443472B2

(12) United States Patent
Chen

(10) Patent No.: US 9,443,472 B2
(45) Date of Patent: Sep. 13, 2016

(54) PIXEL CIRCUIT AND DISPLAY

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventor: Junsheng Chen, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 98 days.

(21) Appl. No.: 14/366,141

(22) PCT Filed: Dec. 12, 2013

(86) PCT No.: PCT/CN2013/089302

§ 371 (c)(1),
(2) Date: Jun. 17, 2014

(87) PCT Pub. No.: WO2015/032147

PCT Pub. Date: Mar. 12, 2015

(65) Prior Publication Data

US 2016/0027379 A1 Jan. 28, 2016

(30) Foreign Application Priority Data

Sep. 6, 2013 (CN) .......................... 2013 1 0404331

(51) Int. Cl.
*G02F 1/133* (2006.01)
*G09G 3/30* (2006.01)
(Continued)

(52) U.S. Cl.
CPC .......... *G09G 3/3258* (2013.01); *G09G 3/3233* (2013.01); *G09G 2300/0426* (2013.01); *G09G 2300/0465* (2013.01); *G09G 2300/0814* (2013.01); *G09G 2300/0819* (2013.01)

(58) Field of Classification Search
CPC .......................... G09G 3/3233; G09G 3/3258
See application file for complete search history.

(56) References Cited

U.S. PATENT DOCUMENTS

2006/0038757 A1* 2/2006 Lee ..................... G09G 3/3233
345/77
2006/0103323 A1 5/2006 Eom et al.
(Continued)

FOREIGN PATENT DOCUMENTS

CN 1779765 A 5/2006
CN 1877667 A 12/2006
(Continued)

OTHER PUBLICATIONS

Written Opinion of the International Searching Authority dated Aug. 4, 2014; PCT/CN2013/089302.
(Continued)

*Primary Examiner* — Lin Li
(74) *Attorney, Agent, or Firm* — Ladas & Parry LLP

(57) ABSTRACT

A pixel circuit and a display are configured to reduce the size of the pixel circuit, and in turn reduce the pixel pitch and increase the pixel number per unit area, and thus improve the display quality of pictures. The pixel circuit comprises a first pixel sub-circuit and a second pixel sub-circuit, and an initialization module (31) and a data voltage writing module (32) connected to the first pixel sub-circuit and the second pixel sub-circuit, wherein the initialization module (31) is connected to a reset signal terminal and a low level terminal, and is configured to initialize the first pixel sub-circuit and the second pixel sub-circuit under the control of a reset signal input at the reset signal terminal; and the data voltage writing module (32) is connected to a data voltage terminal and a gate signal terminal, and is configured, under the control of a signal input at the gate signal terminal, to firstly write a first data voltage to the first pixel sub-circuit and perform compensation for a driving module (331) of the first pixel sub-circuit, and then write a second data voltage to the second pixel sub-circuit and perform compensation for a driving module (332) of the second pixel sub-circuit.

20 Claims, 9 Drawing Sheets

(51) Int. Cl.
*H01L 51/52* (2006.01)
*G09G 3/32* (2006.01)

(56) References Cited

U.S. PATENT DOCUMENTS

| | | | | |
|---|---|---|---|---|
| 2006/0114193 | A1* | 6/2006 | Kwak | G09G 3/3233 345/76 |
| 2007/0029465 | A1 | 2/2007 | Choi et al. | |
| 2007/0040770 | A1* | 2/2007 | Kim | G09G 3/3233 345/76 |
| 2007/0046581 | A1* | 3/2007 | Kwak | G09G 3/006 345/68 |
| 2007/0159432 | A1* | 7/2007 | Tseng | G09G 3/3241 345/92 |
| 2007/0195019 | A1* | 8/2007 | Ono | G09G 3/3233 345/76 |
| 2008/0048946 | A1* | 2/2008 | Kwak | G09G 3/006 345/76 |
| 2008/0284931 | A1* | 11/2008 | Kimura | G02F 1/13624 349/39 |
| 2009/0268112 | A1* | 10/2009 | Lu | G02F 1/134309 349/38 |
| 2010/0201674 | A1 | 8/2010 | Kim et al. | |
| 2012/0062135 | A1* | 3/2012 | Tamaki | H05B 33/08 315/210 |
| 2012/0139978 | A1* | 6/2012 | Ikeda | G09G 3/3233 345/694 |
| 2013/0208032 | A1* | 8/2013 | Jang | G09G 3/3233 345/694 |
| 2013/0334503 | A1* | 12/2013 | Seo | H01L 51/52 257/40 |

FOREIGN PATENT DOCUMENTS

| | | | |
|---|---|---|---|
| CN | 101075410 | A | 11/2007 |
| CN | 101800026 | A | 8/2010 |
| CN | 203480809 | U | 3/2014 |
| CN | 1766972 | A | 6/2014 |
| JP | 2009-222779 | A | 10/2009 |

OTHER PUBLICATIONS

International Search Report Issued Apr. 16, 2014; Appln. No. PCT/CN2013/089302.

First Chinese Office Action dated Jan. 23, 2015; Appln. No. 201310404331.7.

International Search Report issued Apr. 14, 2014; PCT/CN2013/089308.

First Chinese Office Action dated Mar. 12, 2015; Appln. No. 201310404138.3.

USPTO RR dated Jul. 21, 2015 in connection with U.S. Appl. No. 14/366,417.

USPTO NFOA dated Oct. 19, 2015 in connection with U.S. Appl. No. 14/366,417.

* cited by examiner

PIXEL CIRCUIT AND DISPLAY

TECHNICAL FIELD OF THE DISCLOSURE

The present disclosure relates to the technical field of display, and particularly to a pixel circuit and a display.

BACKGROUND

Currently, array substrates of high-level medium or small size Active Matrix Organic Light Emitting Diode (AMOLED) products mostly employ Low Temperature Poly-Silicon (LTPS) process technology. However, the fluctuation of the LTPS process would cause drifts of threshold voltages of Thin Film Transistor (TFT) devices, such as to cause currents for driving the Organic Light Emitting Diode (OLED) devices unstable and thus decrease the display quality of pictures. A pixel compensation circuit in the prior art is a 6T1C circuit consisting of 6 TFTs and one capacitor, whose circuit diagram is as shown in FIG. 1. In FIG. 1, VDD is a high voltage level signal, VSS is a low voltage level signal, Data is a data signal, Gate is a gate control signal, Reset is an initialization control signal, Vinit is an initialization voltage level signal, EM is a signal for controlling OLED light-emitting whose voltage is supplied by the light-emitting circuit of the OLED panel. However, it is not easy to arrange 6 TFTs and one capacitor in one pixel. It is required to make the TFT devices very small, and thus the performance requirement of the TFT devices is relatively high. On the other hand, it is not possible to further reduce the pixel pitch when 6 TFTs and one capacitor are arranged in one pixel.

As shown in FIG. 2, a number of elements required to be arranged in two pixels in the horizontal direction according to the 6T1C circuit in the prior art are two data signal lines (Data v1 and Data v2), twelve TFTs, two capacitors, one gate control signal Gate line, one light-emitting control signal EM line, one high voltage level signal VDD line, one initialization voltage level signal Vinit line, and one initialization control signal Reset line. There are two OLEDs OLED1 and OLED2 in FIG. 2, whose cathodes are both connected to the low voltage level signal VSS line. FIG. 2 is a circuit principle diagram for two pixels arranged horizontally. The pixel arrangement in the horizontal direction is similar to the pixel arrangement in the vertical pixel arrangement. Therefore, similarly, a number of elements required to be arranged in two pixels in the vertical direction are one data signal line, twelve TFTs, two capacitors, two gate control signal lines, one light-emitting control signal line, one high voltage level signal line, and one initialization voltage level signal.

In conclusion, in the prior art, twelve TFTs and two capacitors are required to be arranged in two pixels.

SUMMARY

In embodiments of the present disclosure, there is provided a pixel circuit configured to reduce the size of the pixel circuit, and in turn reduce the pixel pitch and increase the pixel number per unit area, and thus improve the display quality of pictures. In the embodiments of the present disclosure, there is also provided a display.

According to an embodiment of the present disclosure, there is provided a pixel circuit comprising a first pixel sub-circuit and a second pixel sub-circuit, and an initialization module and a data voltage writing module connected to the first pixel sub-circuit and the second pixel sub-circuit.

The initialization module is connected to a reset signal terminal and a low level terminal, and is configured to initialize the first pixel sub-circuit and the second pixel sub-circuit under the control of a reset signal input at the reset signal terminal.

The data voltage writing module is connected to a data voltage terminal and a gate signal terminal, and is configured, under the control of a signal input at the gate signal terminal, to firstly write a first data voltage to the first pixel sub-circuit and perform compensation for a driving module of the first pixel sub-circuit, and then write a second data voltage to the second pixel sub-circuit and perform compensation for a driving module of the second pixel sub-circuit.

The pixel circuit provided by the embodiment of the present disclosure comprises the first pixel sub-circuit and the second pixel sub-circuit, and the initialization module and the data voltage writing module connected to the first pixel sub-circuit and the second pixel sub-circuit. The pixel circuit consisting of the first pixel sub-circuit, the second pixel sub-circuit, the initialization module and the data voltage writing module can reduce the size of the pixel circuit, and in turn reduce the pixel pitch and increase the pixel number per unit area, and thus improve the display quality of pictures.

Optionally, the first pixel sub-circuit comprises a first driving module, a first light-emitting module, a first threshold compensation module and a first light-emitting control module.

The first threshold compensation module is connected to the initialization module and performs initialization under the control of an initialization signal output by the initialization module. The first threshold compensation module is connected to the first driving module, and is configured to perform threshold voltage compensation for the first driving module.

The first light-emitting module is connected to the first light-emitting control module, and is configured to perform light-emitting display under the effect of the first driving module and the first light-emitting control module.

In this way, the first pixel sub-circuit consisting of the first driving module, the first light-emitting module, the first threshold compensation module and the first light-emitting control module is easy to be implemented in the design of the pixel circuit.

Optionally, the first threshold compensation module comprises a first storage capacitor, a second transistor and a fourth transistor; the first driving module comprises a fifth transistor; the first light-emitting control module comprises a seventh transistor and a ninth transistor; and the first light-emitting module comprises a first light emitting diode.

In this way, the first pixel sub-circuit consisting of the storage capacitor, the transistors and the light emitting diode is easy to be implemented in the design of the pixel circuit.

Optionally, one terminal of the first storage capacitor is connected to a high voltage level signal line, and the other terminal is connected to the source of the second transistor.

The gate of the second transistor is connected to a first control signal line, and the drain of the second transistor is connected to the initialization module and the source of the fourth transistor.

The gate of the fourth transistor is connected to the gate signal terminal, and the source of the fourth transistor is connected to the initialization module.

The gate of the fifth transistor is connected to the initialization module and the source of the fourth transistor, the drain of the fifth transistor is connected to the drain of the fourth transistor, and the source of the fifth transistor is connected to the data voltage writing module.

The gate of the seventh transistor is connected to a light-emitting control signal line, the source of the seventh transistor is connected to the high voltage level signal line, and the drain of the seventh transistor is connected to the source of the fifth transistor.

The gate of the ninth transistor is connected to the light-emitting control signal line, the source of the ninth transistor is connected to the drain of the fifth transistor, and the drain of the ninth transistor is connected to the first light emitting diode.

The anode of the first light emitting diode is connected to the drain of the ninth transistor, and the cathode of the first light emitting diode is connected to a low voltage level signal line.

In this way, the connection relationship of the storage capacitor, the transistors and the light emitting diode is easy to be implemented in the design of the pixel circuit.

Optionally, the second pixel sub-circuit comprises a second driving module, a second light-emitting module, a second threshold compensation module and a second light-emitting control module.

The second threshold compensation module is connected to the initialization module and performs initialization under the control of the initialization signal output by the initialization module. The second threshold compensation module is connected to the second driving module, and is configured to perform threshold voltage compensation for the second driving module.

The second light-emitting module is connected to the second light-emitting control module, and is configured to perform light-emitting display under the effect of the second driving module and the second light-emitting control module.

In this way, the second pixel sub-circuit consisting of the second driving module, the second light-emitting module, the second threshold compensation module and the second light-emitting control module is easy to be implemented in the design of the pixel circuit.

Optionally, the second threshold compensation module comprises a second storage capacitor and an eighth transistor; the second driving module comprises a sixth transistor; the second light-emitting control module comprises a tenth transistor; and the second light-emitting module comprises a second light emitting diode.

In this way, the second pixel sub-circuit consisting of the storage capacitor, the transistors and the light emitting diode is easy to be implemented in the design of the pixel circuit.

Optionally, one terminal of the second storage capacitor is connected to the high voltage level signal line, and the other terminal is connected to the source of the eighth transistor.

The gate of the eighth transistor is connected to a second control signal line, and the drain of the eighth transistor is connected to the initialization module and the source of the fourth transistor.

The gate of the sixth transistor is connected to the source of the eighth transistor, the source of the sixth transistor is connected to the data voltage writing module and the drain of the seventh transistor.

The gate of the tenth transistor is connected to the light-emitting control signal line, the source of the tenth transistor is connected to the drain of the sixth transistor, and the drain of the tenth transistor is connected to the second light emitting diode.

The anode of the second light emitting diode is connected to the drain of the tenth transistor, and the cathode of the second light emitting diode is connected to the low voltage level signal line.

In this way, the connection relationship of the storage capacitor, the transistors and the light emitting diode is easy to be implemented in the design of the pixel circuit.

Optionally, the initialization module comprises a third transistor. The gate of the third transistor is connected to a reset signal line, the source of the third transistor is connected to the source of the fourth transistor in the first threshold compensation module of the first pixel sub-circuit and the drain of the eighth transistor in the second threshold compensation module of the second pixel sub-circuit, and the drain of the third transistor is connected to the low voltage level signal line.

In this way, the initialization module comprises the third transistor as a switch device of the initialization module in the pixel circuit. It is easy to be implemented in the circuit design.

Optionally, the data voltage writing module comprises a first transistor. The gate of the first transistor is connected to the gate signal control line, the source of the first transistor is connected to a data signal line, and the drain of the first transistor is connected to the source of the fifth transistor in the first driving module of the first pixel sub-circuit and the source of the sixth transistor in the second driving module of the second pixel sub-circuit.

In this way, the data voltage writing module comprises the first transistor as a switch device of the data voltage writing module in the pixel circuit. It is easy to be implemented in the circuit design.

Optionally, the data voltage input into the data voltage writing module comprises a first data voltage and a second data voltage, the first data voltage is configured to drive the first threshold compensation module to perform threshold voltage compensation for the first driving module, and the second data voltage is configured to drive the second threshold compensation module to perform threshold voltage compensation for the second driving module.

In this way, it is possible to input two different voltage values by one data signal line since the data signal is a step-like timing signal.

Optionally, both the first light emitting diode and the second light emitting diode are organic light emitting diodes.

In this way, using organic light emitting diodes as the light emitting diodes in the first light-emitting module and the second light-emitting module in the pixel circuit is easy to be implemented in the circuit design.

Optionally, the transistors are all P-type thin film transistors.

In this way, using P-type thin film transistors as the thin film transistors in the pixel circuit is easy to be implemented in the circuit design.

The display provided by an embodiment of the present disclosure comprises a plurality of pixels, a plurality of data signal lines and a plurality of gate control signal lines, wherein every two pixels constitute one pixel unit, and the display also comprises the pixel circuit as described in the above connected to each pixel unit.

In this way, since the display comprises the pixel circuit as described in the above connected to each pixel unit, the display has the advantages of the pixel circuit, and can improve the display quality of pictures greatly.

Optionally, the two pixels in each pixel unit share one data signal line.

In this way, the two pixels in each pixel unit share one data signal line; therefore, one data signal line can be omitted every two pixels, and the arrangement manner of the data signal lines is easy and feasible.

Optionally, the two pixels in each of the pixel units share one gate control signal line.

In this way, the two pixels in each pixel unit share one gate control signal line; therefore, one gate control line can be omitted every two pixels, and the arrangement manner of the gate control signal lines is easy and feasible.

DETAILED DESCRIPTION

In embodiments of the present disclosure, there are provided a pixel circuit and a display, which are configured to reduce the size of the pixel circuit, and in turn reduce the pixel pitch and increase the pixel number per unit area, and thus improve the display quality of pictures.

The pixel circuit provided by an embodiment of the present disclosure is an AMOLED pixel circuit. Since the AMOLED pixel circuit can function to perform compensation for the driving module of the pixel, the AMOLED pixel circuit in the present disclosure can also be referred to as an AMOLED pixel compensation circuit.

The detailed description of the technical solutions provided by embodiments of the present disclosure will be given in the following.

Figure 1:
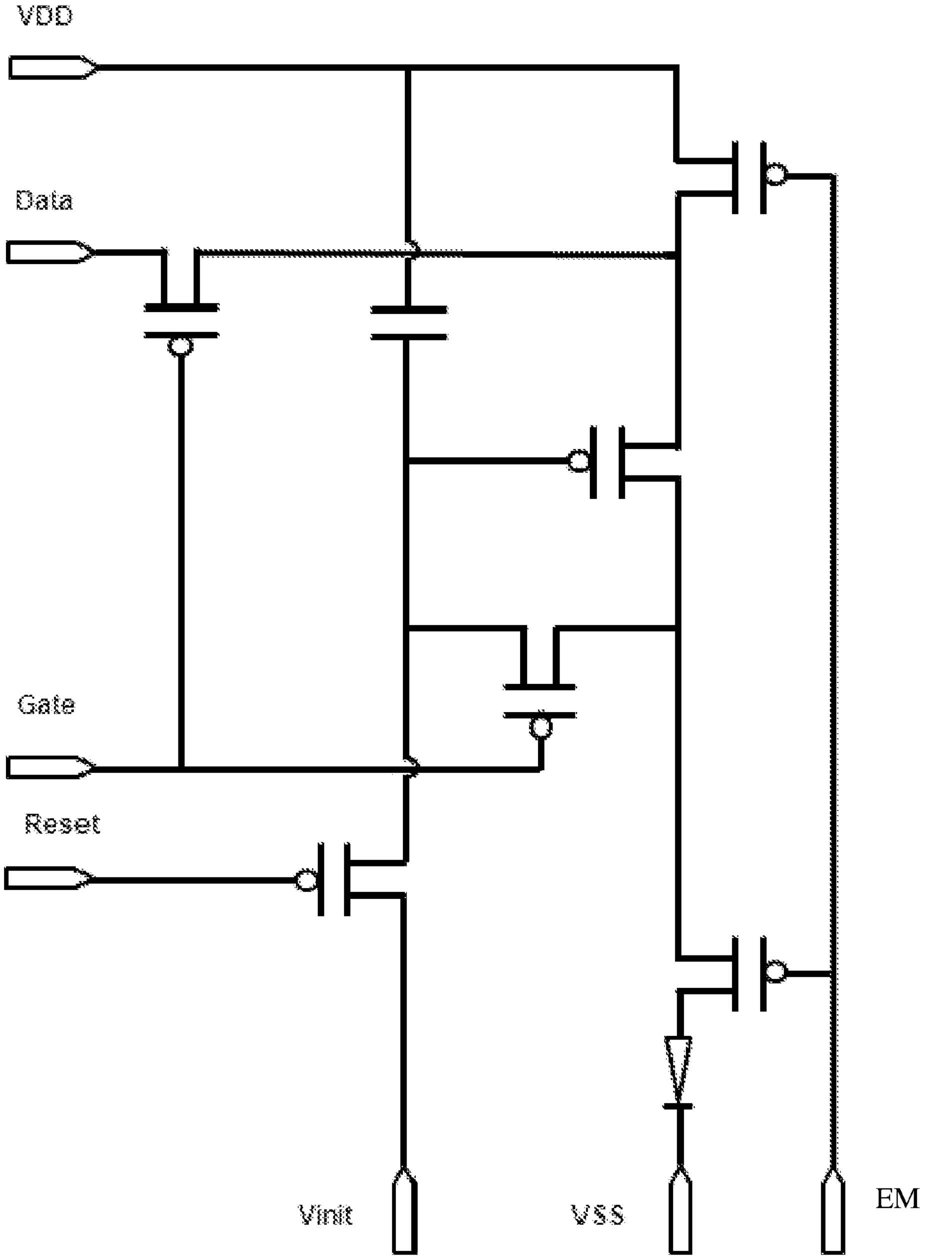
Prior Art Fig.1
FIG. 1 is a schematic diagram of the 6T1C AMOLED pixel compensation circuit in a single pixel in the prior art.
Figure 2:
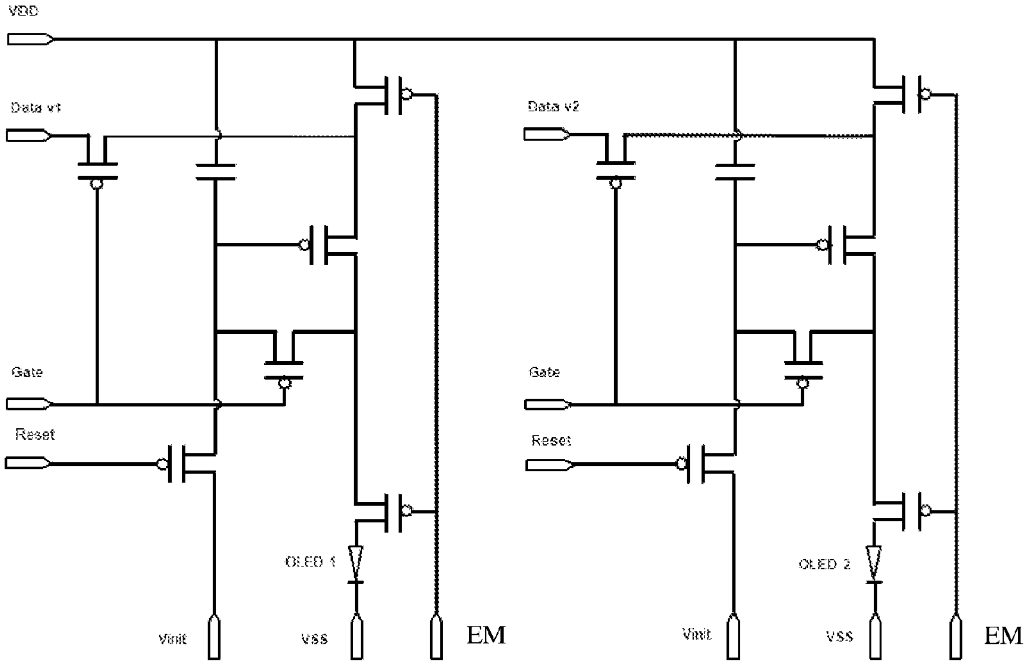
Prior Art Fig.2
FIG. 2 is a schematic diagram of the 12T2C AMOLED pixel compensation circuit in two pixels in the prior art.
Figure 3:
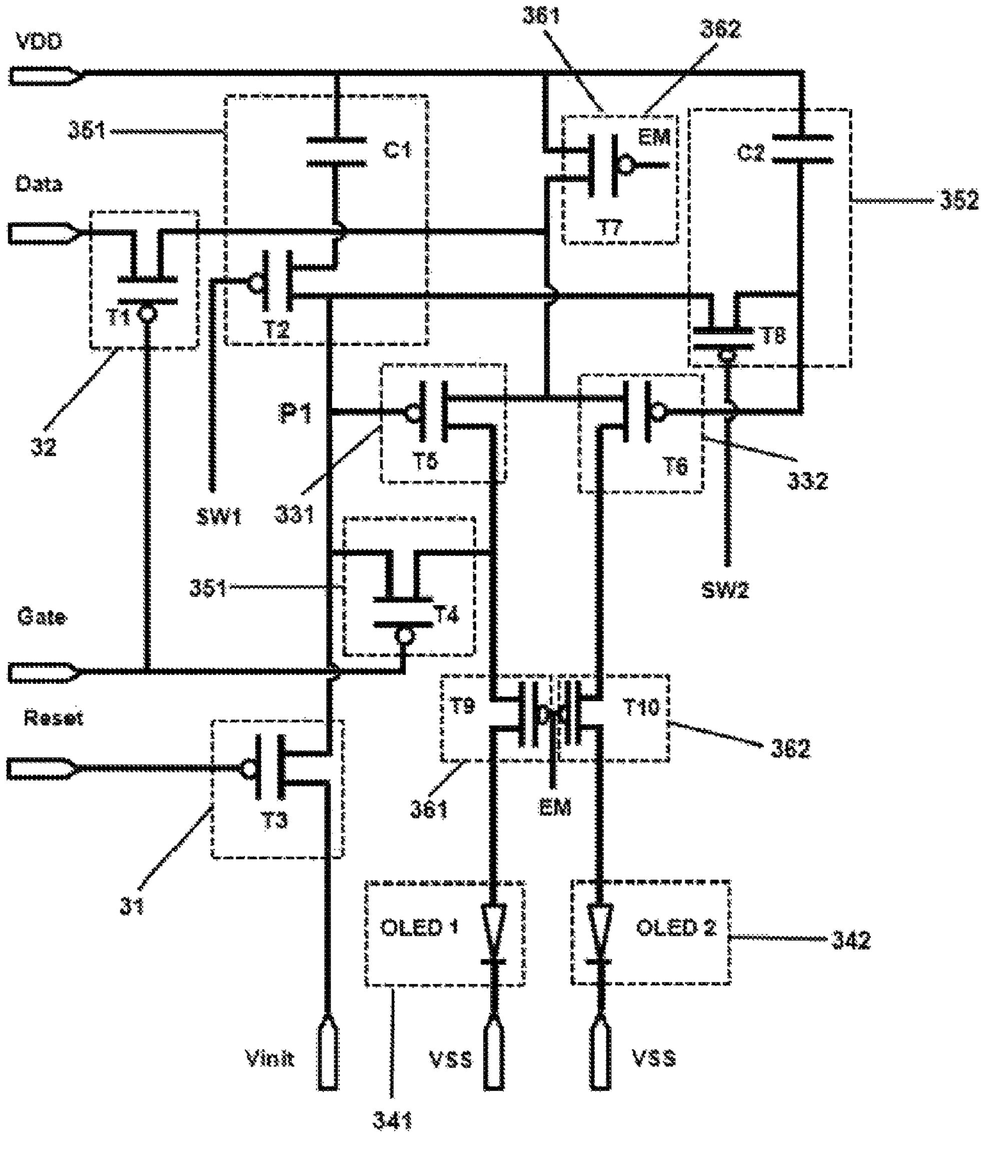
FIG. 3 is a schematic diagram of a 10T2C AMOLED pixel circuit provided by an embodiment of the present disclosure.

As shown in FIG. 3, an AMOLED pixel circuit provided by an embodiment of the present disclosure comprises a first pixel sub-circuit and a second pixel sub-circuit, and an initialization module 31 and a data voltage writing module 32 connected to the first pixel sub-circuit and the second pixel sub-circuit.

The initialization module 31 is connected to a reset signal terminal (corresponding to an initialization control signal Reset of the AMOLED pixel circuit) and a low level terminal (corresponding to an initialization voltage level signal Vinit of the AMOLED pixel circuit), and is configured to initialize the first pixel sub-circuit and the second pixel sub-circuit under the control of a reset signal input at the reset signal terminal.

The data voltage writing module 32 is connected to a data voltage terminal (corresponding to a data signal Data of the AMOLED pixel circuit) and a gate signal terminal (corresponding to a gate control signal Gate of the AMOLED pixel circuit), and is configured, under the control of the signal input at the gate signal terminal, to firstly write a first data voltage to the first pixel sub-circuit and perform compensation for a driving module of the first pixel sub-circuit, and then write a second data voltage to the second pixel sub-circuit and perform compensation for a driving module of the second pixel sub-circuit.

In the circuit shown in FIG. 3, in order to distinguish crossing points between conductive wires that are connected from crossing points between conductive wires that are not connected, the crossing points between the conductive wires that are connected are represented by solid circles, and the crossing points between the conductive wires that are not connected are represented by hollow circles.

Optionally, the first pixel sub-circuit comprises a first driving module 331, a first light-emitting module 341, a first threshold compensation module 351 and a first light-emitting control module 361.

The first threshold compensation module 351 is connected to the initialization module 31 and performs initialization under the control of an initialization signal output by the initialization module 31. The first threshold compensation module 351 is connected to the first driving module 331, and is configured to perform threshold voltage compensation for the first driving module.

The first light-emitting module 341 is connected to the first light-emitting control module 361, and is configured to perform light-emitting display under the effect of the first driving module 331 and the first light-emitting control module 361.

Optionally, the first threshold compensation module 351 comprises a first storage capacitor C1, a second transistor T2 and a fourth transistor T4; the first driving module 331 comprises a fifth transistor T5; the first light-emitting control module 361 comprises a seventh transistor T7 and a ninth transistor T9; and the first light-emitting module 341 comprises a first light emitting diode OLED1.

Optionally, one terminal of the first storage capacitor C1 is connected to a high voltage level signal line (corresponding to the high voltage level signal VDD), and the other terminal is connected to the source of the second transistor.

The gate of the second transistor T2 is connected to a first control signal line (corresponding to a first control signal SW1 of the AMOLED pixel circuit), and the drain of the second transistor T2 is connected to the initialization module 31.

The gate of the fourth transistor T4 is connected to the gate signal terminal (corresponding to the gate control signal Gate of the AMOLED pixel circuit), and the source of the fourth transistor T4 is connected to the initialization module 31.

The gate of the fifth transistor T5 is connected to the initialization module 31, the drain of the fifth transistor T5 is connected to the drain of the fourth transistor T4, and the source of the fifth transistor T5 is connected to the data voltage writing module 32.

The gate of the seventh transistor T7 is connected to a light-emitting control signal line (corresponding to a light-emitting control signal EM of the AMOLED pixel circuit), the source of the seventh transistor T7 is connected to the high voltage level signal line (corresponding to the high voltage level signal VDD), and the drain of the seventh transistor T7 is connected to the source of the fifth transistor T5.

The gate of the ninth transistor T9 is connected to the light-emitting control signal line (corresponding to the light-emitting signal EM of the AMOLED pixel circuit), the source of the ninth transistor T9 is connected to the drain of the fifth transistor T5, and the drain of the ninth transistor T9 is connected to the first light emitting diode OLED1.

The anode of the first light emitting diode OLED1 is connected to the drain of the ninth transistor T9, and the cathode of the first light emitting diode OLED1 is connected to a low voltage level signal line (corresponding to a low voltage level signal VSS).

Optionally, the second pixel sub-circuit comprises a second driving module 332, a second light-emitting module 342, a second threshold compensation module 352 and a second light-emitting control module 362.

The second threshold compensation module 352 is connected to the initialization module 31 and performs initialization under the control of the initialization signal output by the initialization module 31. The second threshold compensation module 352 is connected to the second driving module 332, and is configured to perform threshold voltage compensation for the second driving module 332.

The second light-emitting module 342 is connected to the second light-emitting control module 362, and is configured to perform light-emitting display under the effect of the second driving module 332 and the second light-emitting control module 362.

Optionally, the second threshold compensation module 352 comprises a second storage capacitor C2 and an eighth transistor T8; the second driving module 332 comprises a sixth transistor T6; the second light-emitting control module 362 comprises a tenth transistor T10; and the second light-emitting module 342 comprises a second light emitting diode OLED2.

Optionally, one terminal of the second storage capacitor C2 is connected to the high voltage level signal line (corresponding to the high voltage level signal VDD), and the other terminal is connected to the source of the eighth transistor T8.

The gate of the eighth transistor T8 is connected to a second control signal line (corresponding to a second control signal SW2 of the AMOLED pixel circuit), and the drain of the eighth transistor T8 is connected to the initialization module 31.

The gate of the sixth transistor T6 is connected to the source of the eighth transistor T8, the source of the sixth transistor T6 is connected to the data voltage writing module 32 and the drain of the seventh transistor T7, and the drain of the sixth transistor T6 is connected to the second light emitting diode OLED2.

The gate of the tenth transistor T10 is connected to the light-emitting control signal line (corresponding to the light-emitting control signal EM of the AMOLED pixel circuit), the source of the tenth transistor T10 is connected to the drain of the sixth transistor T6, and the drain of the tenth transistor T10 is connected to the second light emitting diode OLED2.

The anode of the second light emitting diode OLED2 is connected to the drain of the tenth transistor T10, and the cathode of the second light emitting diode OLED2 is connected to the low voltage level signal line (corresponding to the low voltage level signal VSS).

The light-emitting control modules 361 and 362 can control the light emitting of OLED1 and the light emitting of OLED2 simultaneously, or can control the light emitting of OLED1 and the light emitting of OLED2 separately.

Optionally, the initialization module 31 comprises a third transistor T3. The gate of the third transistor T3 is connected to a reset signal line (corresponding to the initialization control signal Reset of the AMOLED pixel circuit), the source of the third transistor T3 is connected to the first threshold compensation module 351 of the first pixel sub-circuit and the second threshold compensation module 352 of the second pixel sub-circuit, and the drain of the third transistor T3 is connected to the low voltage level signal line (corresponding to the initialization voltage level signal Vinit of the AMOLED pixel circuit).

Optionally, the data voltage writing module 32 comprises a first transistor T1. The gate of the first transistor T1 is connected to the gate signal control line (corresponding to the gate control signal Gate of the AMOLED pixel circuit), the source of the first transistor T1 is connected to the data signal line (corresponding to the data signal Data of the AMOLED pixel circuit), and the drain of the first transistor T1 is connected to the first driving module 331 of the first pixel sub-circuit and the second driving module 332 of the second pixel sub-circuit.

Optionally, the data voltage input into the data voltage writing module 32 comprises a first data voltage and a second data voltage, the first data voltage is configured to drive the first threshold compensation module 351 to perform threshold voltage compensation for the first driving module 331, and the second data voltage is configured to drive the second threshold compensation module 352 to perform threshold voltage compensation for the second driving module 332.

Optionally, both the first light emitting diode OLED1 and the second light emitting diode OLED2 are organic light emitting diodes.

Optionally, the transistors T1, T2, T3, T4, T5, T6, T7, T8, T9 and T10 are all P-type thin film transistors.

In the following, the operation principle of the AMOLED pixel circuit provided by the embodiments of the present disclosure will be described in detail in connection with FIG. 3-FIG. 8.

Figure 4:
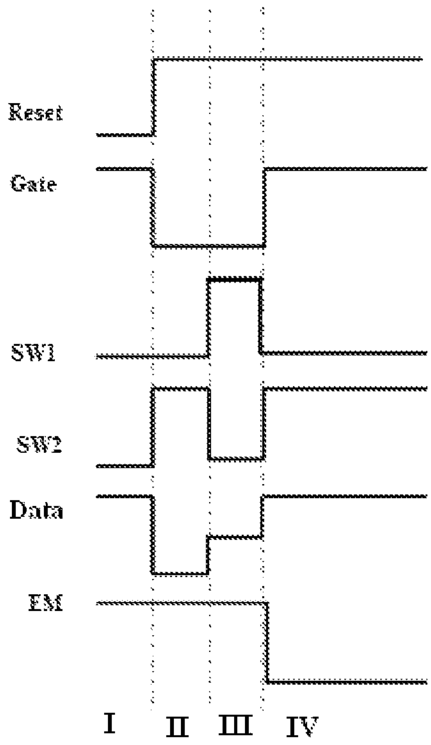
FIG. 4 is a timing chart of the operation of a 10T2C AMOLED pixel circuit provided by an embodiment of the present disclosure.
Figure 5:
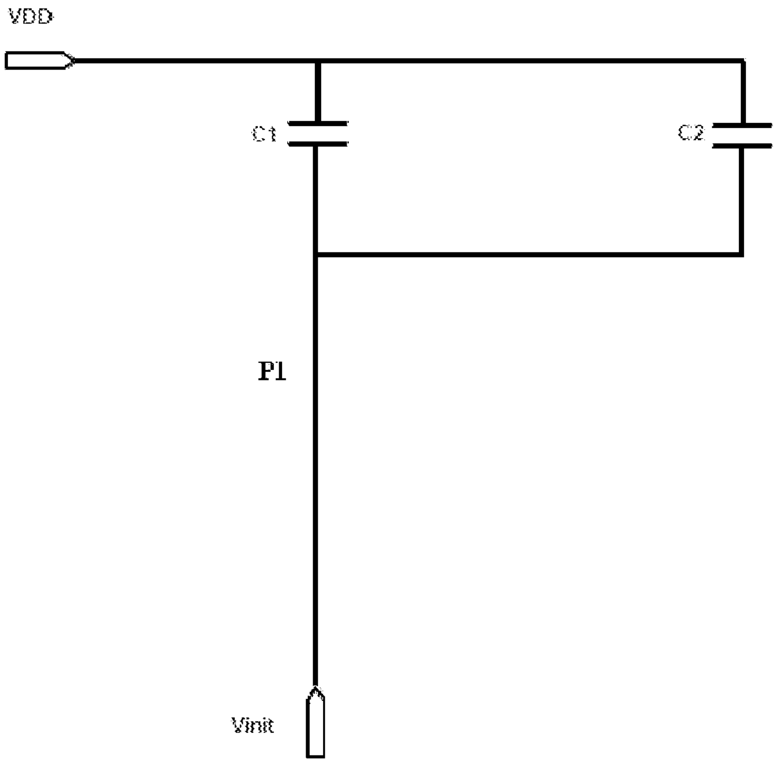
FIG. 5 is a simplified circuit diagram at an initialization operation stage of a 10T2C AMOLED pixel circuit provided by an embodiment of the present disclosure.

As shown in FIG. 4, at stage I, the gate control signal Gate and the light-emitting control signal EM are at high levels; the initialization control signal Reset, the first control signal SW1 and the second control signal SW2 are at low levels. At this time, the third transistor T3, the second transistor T2 and the eighth transistor T8 in FIG. 3 are turned on, and the first transistor T1, the fourth transistor T4, the seventh transistor T7, the ninth transistor T7, the ninth transistor T9 and the tenth transistor T10 in FIG. 3 are turned off. Therefore, the simplified circuit diagram of FIG. 3 is as shown in FIG. 5. Since the storage capacitors C1 and C2 store the data signal Data input by the last frame of picture respectively, at this point, the two capacitors are both connected with the initialization voltage level signal Vinit having a low level, and the storage capacitors C1 and C2 are both discharged to reach the initialization voltage Vinit under the control of the initialization voltage level signal Vinit.

Figure 6:
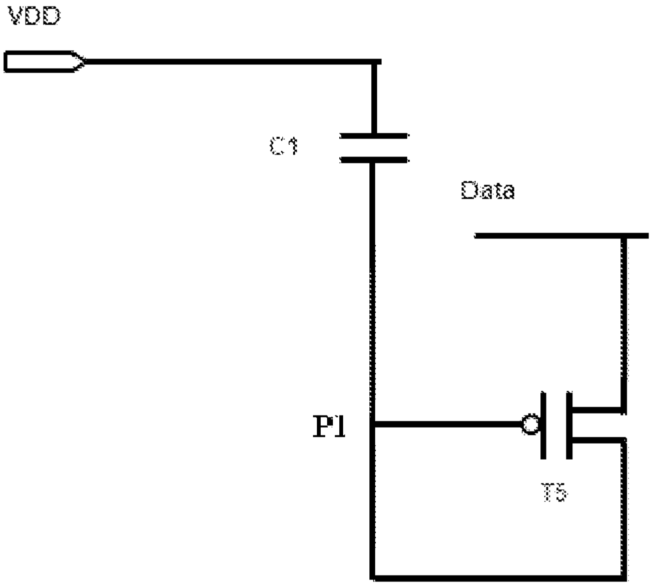
FIG. 6 is a simplified circuit diagram at a first threshold compensation stage of a 10T2C AMOLED pixel circuit provided by an embodiment of the present disclosure.

As shown in FIG. 4, at stage II, the initialization control signal Reset, the second control signal SW2 and the light-emitting control signal EM are at high levels; the gate control signal Gate and the first control signal SW1 are at low levels. At this time, the first transistor T1, the second transistor T2 and the fourth transistor T4 in FIG. 3 are turned on, and the third transistor T3, the eighth transistor T8, the seventh transistor T7, the ninth transistor T9 and the tenth transistor T10 in FIG. 3 are turned off. Therefore, the simplified diagram of FIG. 3 is as shown in FIG. 6. The data level signal Data inputs a first data voltage value V1. At this point, the fifth transistor T5 is equivalent to a diode since the fourth transistor T4 is turned on. The voltage at a first node P1 becomes V=V1−Vth(T5), where Vth(T5) is the threshold voltage of the fifth transistor T5, and the voltage V is stored in the storage capacitor C1.

Figure 7:
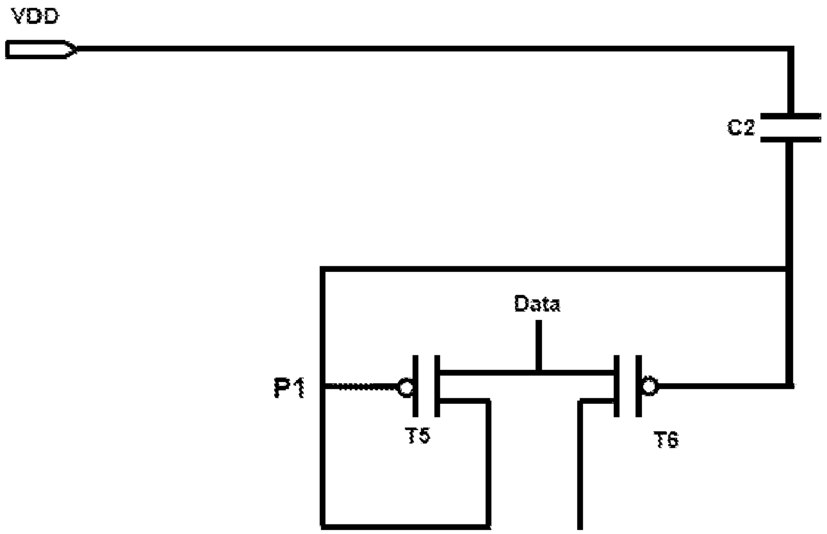
FIG. 7 is a simplified circuit diagram at a second threshold compensation stage of a 10T2C AMOLED pixel circuit provided by an embodiment of the present disclosure.

As shown in FIG. 4, at stage III, the initialization control signal Reset, the first control signal SW1 and the light-emitting control signal EM are at high levels, and the gate control signal Gate and the second control signal SW2 are at low levels. At this time, the first transistor T1, the fourth transistor T4 and the eighth transistor T8 in FIG. 3 are turned on, and the second transistor T2, the third transistor T3, the seventh transistor T7, the ninth transistor T9 and the tenth transistor T10 in FIG. 3 are turned off. Therefore, the simplified circuit diagram of FIG. 3 is as shown in FIG. 7. The data level signal Data inputs a second data voltage value V2. At this time, the fifth transistor T5 is equivalent to a diode since the fourth transistor T4 is turned on. The voltage at the first node P1 becomes V'=V2−Vth(T5), where Vth (T5) is the threshold voltage of the fifth transistor T5. In design, the fifth transistor T5 and the sixth transistor T6 have identical parameters and are located at close positions, so Vth(T5)=Vth(T6) can be assumed approximately, where Vth(T6) is the threshold voltage of the sixth transistor T6. Therefore, we can get V'=V2−Vth(T6), and the voltage V' is stored in the storage capacitor C2.

Figure 8:
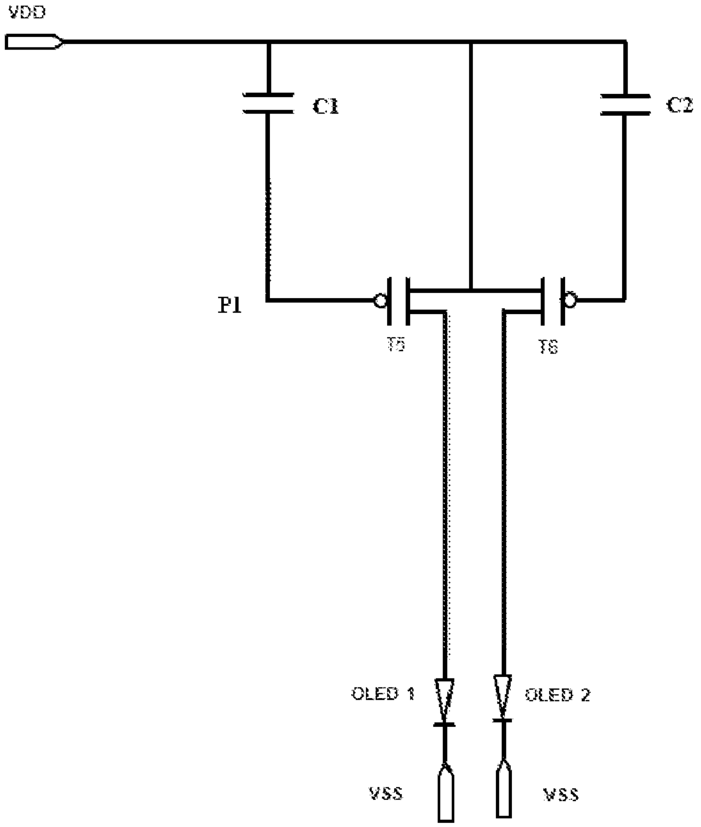
FIG. 8 is a simplified circuit diagram at a light emitting stage of a 10T2C AMOLED pixel circuit provided by an embodiment of the present disclosure.

As shown in FIG. 4, at stage IV, i.e., the light-emitting stage, the initialization control signal Reset, the gate control signal Gate and the second control signal SW2 are at high levels, and the first control signal SW1 and the light-emitting control signal EM are at low levels. At this time, the second transistor T2, the seventh transistor T7, the ninth transistor T9 and the tenth transistor T10 in FIG. 3 are turned on, and the first transistor T1, the third transistor T3, the fourth transistor T4 and the eighth transistor T8 in FIG. 3 are turned off. Therefore, the simplified circuit diagram of FIG. 3 is as shown in FIG. 8. The fifth transistor T5 and the sixth transistor T6 are the driving transistors for the OLED, and control current in the following way.

The source of the fifth transistor T5 and the source of the sixth transistor T6 are both connected with the high voltage level signal VDD. The current flowing through the first light emitting diode OLED1 is $$Id1 = \frac{k}{2} * [VDD - V - Vth(T5)]^2 =$$

-continued $$\frac{k}{2} * [VDD - (V1 - Vth(T5)) - Vth(T5)]^2 = \frac{k}{2} * (VDD - V1)^2$$

where k is a preset constant. The current flowing through the second light emitting diode OLED2 is $$Id2 = \frac{k}{2} * [VDD - V' - Vth(T6)]^2 = \frac{k}{2} * [VDD - (V2 - Vth(T6) - Vth(T6)]^2 = \frac{k}{2} * (VDD - V2)^2.$$

As seen from the above equations, the current Id1 flowing through the first light emitting diode OLED1 and the current Id2 flowing through the second light emitting diode OLED2 are irrelevant to the threshold voltage Vth(T5) of the fifth transistor T5 and the threshold voltage Vth(T6) of the sixth transistor T6, and thus can function for compensation.

In conclusion, the AMOLED pixel circuit provided by the embodiments of the present disclosure comprises 10 thin film transistors and 2 capacitors, which is a 10T2C AMOLED pixel circuit.

A display provided by an embodiment of the present disclosure comprises a plurality of pixels, a plurality of data signal lines and a plurality of gate control signal lines, wherein every two pixels constitute one pixel unit, and the display also comprises the 10T2C AMOLED pixel circuit provided by the embodiments of the present disclosure connected to each pixel unit.

The arrangement manners for the pixel unit comprising 2 pixels will be described in detail in the following.

Figure 9:
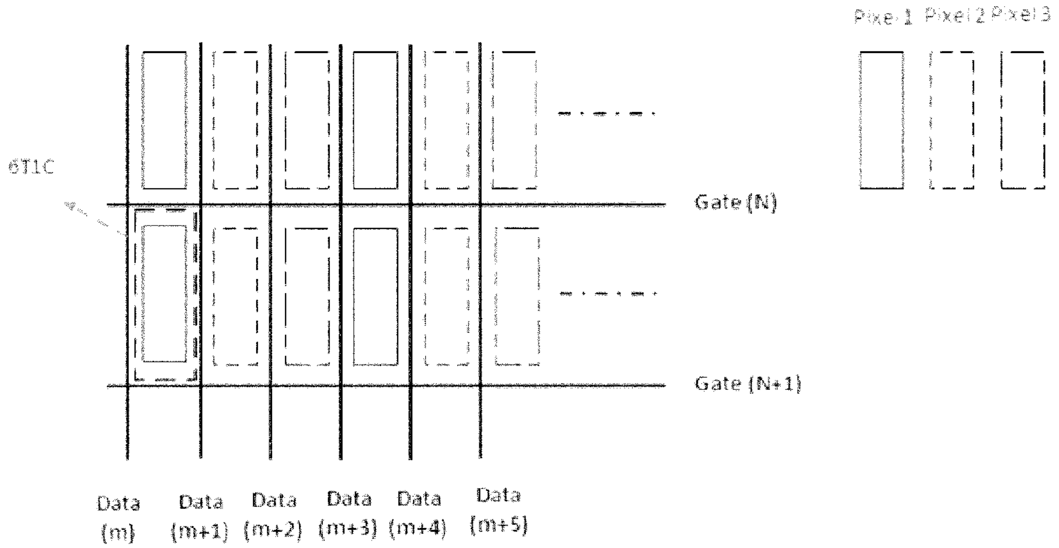
FIG. 9 is an arrangement schematic diagram of individual pixels in the prior art.

The pixel arrangement manner of individual pixels in the prior art is as shown in FIG. 9. The compensation circuit in each of the individual pixels is the 6T1C AMOLED pixel compensation circuit in the prior art. If two pixels are placed together to form a pixel unit, the compensation circuit of the pixel unit in the prior art is the 12T2C AMOLED pixel compensation circuit in the prior art.

Figure 10:
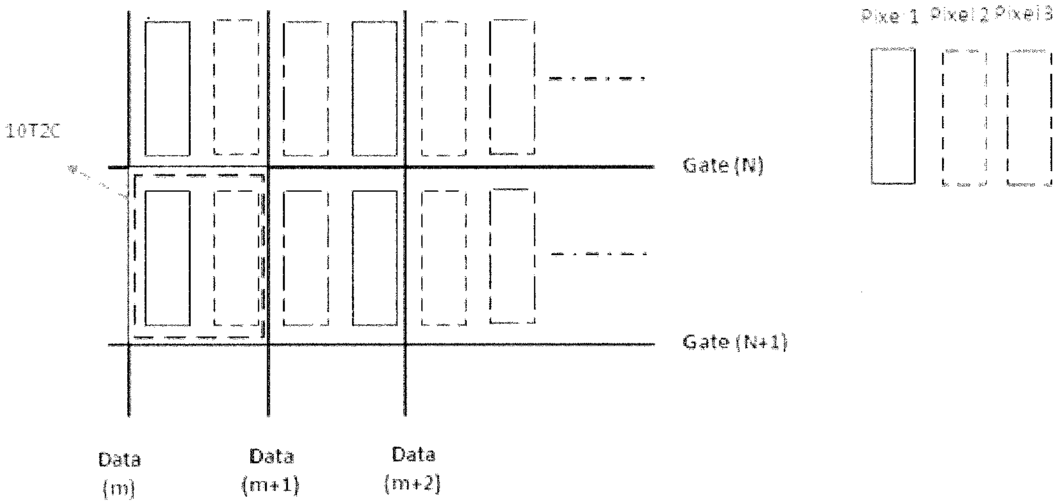
FIG. 10 is an arrangement schematic diagram of the pixel units consisting of two pixels in the horizontal direction provided by an embodiment of the present disclosure.
Figure 11:
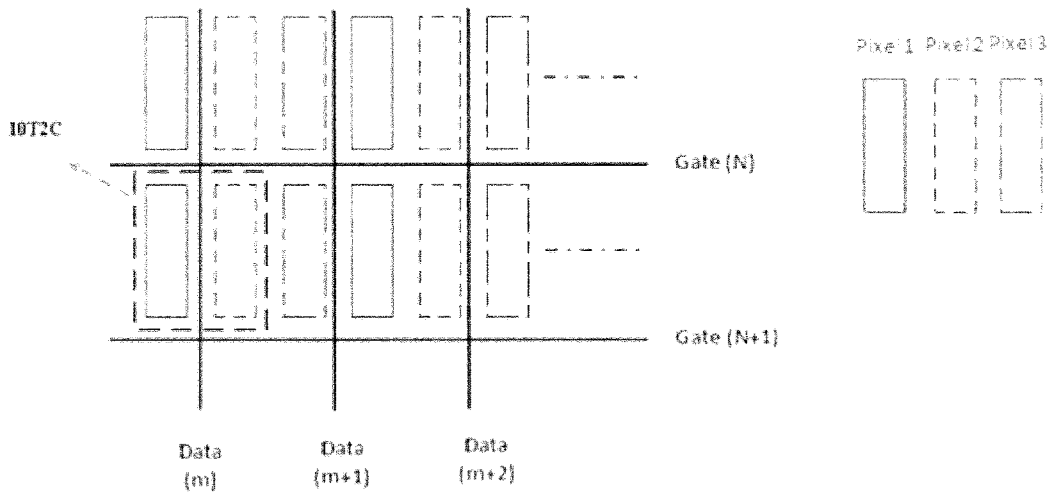
FIG. 11 is another arrangement schematic diagram of the pixel units consisting of two pixels in the horizontal direction provided by an embodiment of the present disclosure.
Figure 12:
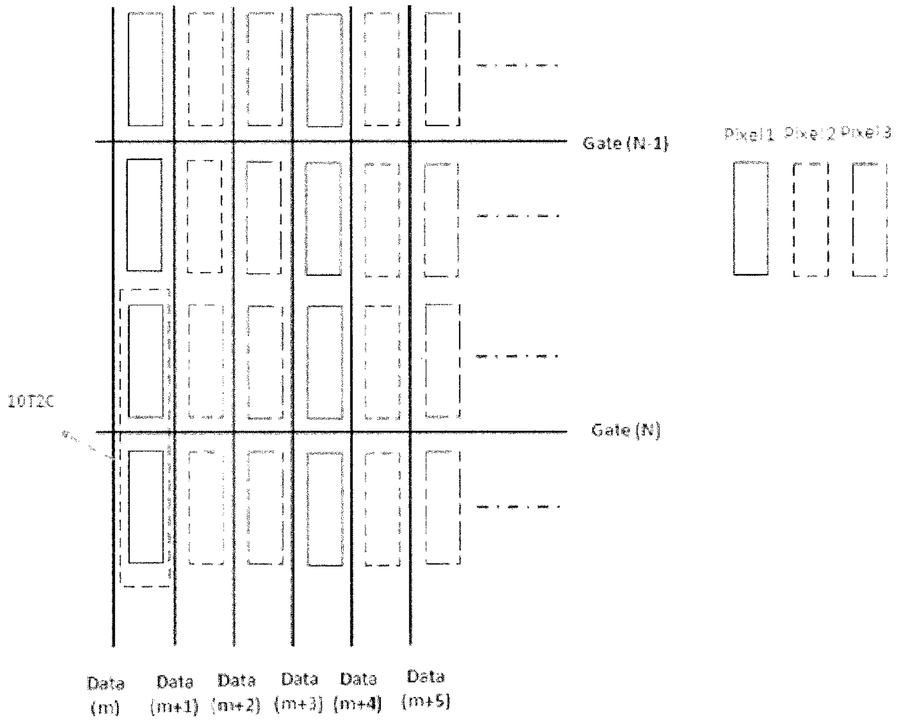
FIG. 12 is an arrangement schematic diagram of the pixel units consisting of two pixels in the vertical direction provided by an embodiment of the present disclosure.
Figure 13:
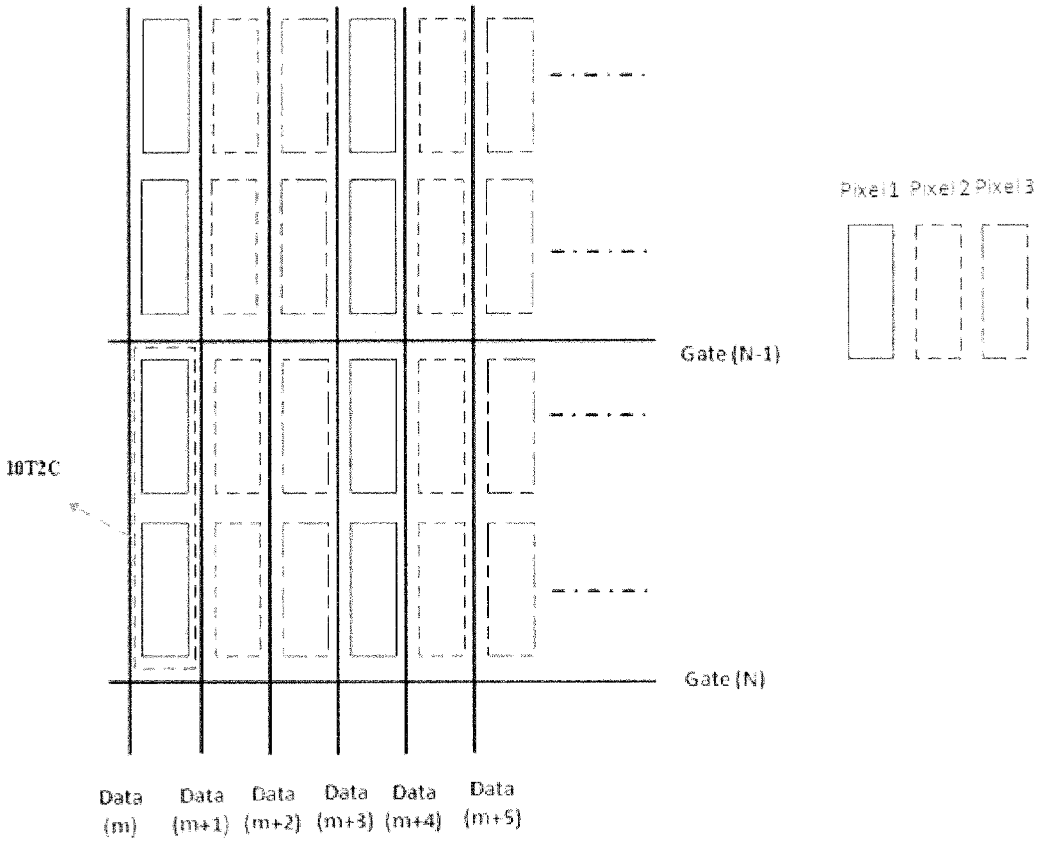
FIG. 13 is another arrangement schematic diagram of the pixel units consisting of two pixels in the vertical direction provided by an embodiment of the present disclosure.

The arrangement manner of the pixel unit comprising 2 pixels provided by the embodiments of the present disclosure is shown in FIGS. 10-13. As shown in FIGS. 10 and 11, the two pixels arranged in the horizontal direction in any pixel unit share one data signal line Data (m). As shown in FIGS. 12 and 13, the two pixels arranged in the vertical direction in any pixel unit share one gate control signal line Gate (N). The two pixels arranged in the horizontal direction in any pixel unit are any two pixels in the horizontal direction, such as Pixel 1 and Pixel 2, or Pixel 2 and Pixel 3. The two pixels arranged in the vertical direction in any pixel unit are any two pixels in the vertical direction.

As shown in FIG. 10 and FIG. 11, said the two pixels arranged in the horizontal direction in any pixel unit sharing one data signal line Data (m) includes that the data signal line Data (m) is located between the two pixels Pixel 1 and Pixel 2 arranged in the horizontal direction (as shown in FIG. 11) or that the data signal line Data (m) is located at the outer side of Pixel 1 of the two pixels Pixel 1 and Pixel 2 arranged in the horizontal direction (as shown in FIG. 10). Of course, the data signal line Data (m) in the embodiments of the present disclosure is not limited to being located at the outer side of Pixel 1 (the inner side refers to the side at which the two pixels arranged in the horizontal direction in any pixel unit are close to each other, and the outer side refers to the side at which the two pixels are distant from each other), but can be located at the outer side of either pixel of the two pixels arranged in the horizontal direction, for example, at the left side of Pixel 1, or at the right side of Pixel 2).

As shown in FIGS. 12 and 13, said the two pixels arranged in the vertical direction in any pixel unit sharing one gate control signal line Gate (N) includes that the gate control signal line Gate (N) is located between the two pixels arranged in the vertical direction in a pixel unit (as shown in FIG. 12) or that the gate control signal line Gate (N) is located at the outer side of either of the two pixels arranged in the vertical direction in the pixel unit (as shown in FIG. 13).

In conclusion, in the technical solutions provided by the embodiments of the present disclosure, the AMOLED pixel circuit comprises the first pixel sub-circuit and the second pixel sub-circuit, and the initialization module and the data voltage writing module connected to the first pixel sub-circuit and the second pixel sub-circuit. The initialization module is connected to the reset signal terminal and the low level terminal, and is configured to initialize the first pixel sub-circuit and the second pixel sub-circuit under the control of the reset signal input at the reset signal terminal. The data voltage writing module is connected to the data voltage terminal and the gate signal terminal, and is configured, under the control of the signal input at the gate signal terminal, to firstly write the first data voltage to the first pixel sub-circuit and then write the second data voltage to the second pixel sub-circuit; the first pixel sub-circuit performs compensation for the driving module of the first pixel, and the second pixel sub-circuit performs compensation for the driving module of the second pixel. The AMOLED pixel circuit can reduce the size of the pixel circuit, and in turn reduce the pixel pitch and increase the pixel number per unit area, and thus improve the display quality of pictures.

It is obvious that those skilled in the art may make various modifications and variations to the above embodiments without departing the spirit and scope of the present disclosure as defined by the following claims. Such variations and modifications are intended to be included within the scope of the present disclosure if they fall in the scope of the claims of the present disclosure and equivalents thereof.

What is claimed is:

1. A pixel circuit comprising a first pixel sub-circuit and a second pixel sub-circuit different from the first pixel sub-circuit, and an initialization module and a data voltage writing module connected to the first pixel sub-circuit and the second pixel sub-circuit, wherein the initialization module is connected to a reset signal terminal and a low level terminal, and is configured to initialize the first pixel sub-circuit and the second pixel sub-circuit under the control of a reset signal input at the reset signal terminal; and the data voltage writing module is connected to a data voltage terminal and a gate signal terminal, and is configured, under the control of a signal input at the gate signal terminal, to firstly write a first data voltage to the first pixel sub-circuit, and then write a second data voltage to the second pixel sub-circuit;

wherein while the first data voltage is written to the first pixel sub-circuit, the first pixel sub-circuit performs compensation on a first driving module of the first pixel sub-circuit; and while the second data voltage is written to the second pixel sub-circuit, the second pixel sub-circuit performs compensation on a second driving module of the second pixel sub-circuit;

wherein after the first data voltage is written into the first pixel sub-circuit and the second data voltage is written into the second pixel sub-circuit, the first pixel sub-circuit and the second pixel sub-circuit emit light concurrently.

2. The pixel circuit of claim 1, wherein the first pixel sub-circuit comprises the first driving module, a first light-emitting module, a first threshold compensation module and a first light-emitting control module, the first threshold compensation module is connected to the initialization module and performs initialization under the control of an initialization signal output by the initialization module;

the first threshold compensation module is connected to the first driving module, and is configured to perform threshold voltage compensation for the first driving module; and the first light-emitting module is connected to the first light-emitting control module, and is configured to perform light-emitting display under the effect of the first driving module and the first light-emitting control module.

3. The pixel circuit of claim 2, wherein the first threshold compensation module comprises a first storage capacitor, a second transistor and a fourth transistor; the first driving module comprises a fifth transistor; the first light-emitting control module comprises a seventh transistor and a ninth transistor; and the first light-emitting module comprises a first light emitting diode.

4. The pixel circuit of claim 3, wherein one terminal of the first storage capacitor is connected to a high voltage level signal line, and the other terminal is connected to a source of the second transistor;

a gate of the second transistor is connected to a first control signal line, and a drain of the second transistor is connected to the initialization module and a source of the fourth transistor;

a gate of the fourth transistor is connected to the gate signal terminal, and the source of the fourth transistor is connected to the initialization module;

a gate of the fifth transistor is connected to the initialization module and the source of the fourth transistor, a drain of the fifth transistor is connected to a drain of the fourth transistor, and a source of the fifth transistor is connected to the data voltage writing module;

a gate of the seventh transistor is connected to a light-emitting control signal line, a source of the seventh transistor is connected to the high voltage level signal line, and a drain of the seventh transistor is connected to the source of the fifth transistor;

a gate of the ninth transistor is connected to the light-emitting control signal line, a source of the ninth transistor is connected to the drain of the fifth transistor, and a drain of the ninth transistor is connected to the first light emitting diode; and an anode of the first light emitting diode is connected to the drain of the ninth transistor, and an cathode of the first light emitting diode is connected to a low voltage level signal line.

5. The pixel circuit of claim 1, wherein the second pixel sub-circuit comprises the second driving module, a second light-emitting module, a second threshold compensation module and a second light-emitting control module, the second threshold compensation module is connected to the initialization module and performs initialization under the control of the initialization signal output by the initialization module;

the second threshold compensation module is connected to the second driving module, and is configured to perform threshold voltage compensation for the second driving module; and the second light-emitting module is connected to the second light-emitting control module, and is configured to perform light-emitting display under the effect of the second driving module and the second light-emitting control module.

6. The pixel circuit of claim 5, wherein the second threshold compensation module comprises a second storage capacitor and an eighth transistor;

the second driving module comprises a sixth transistor; the second light-emitting control module comprises a tenth transistor; and the second light-emitting module comprises a second light emitting diode.

7. The pixel circuit of claim 6, wherein one terminal of the second storage capacitor is connected to the high voltage level signal line, and the other terminal is connected to a source of the eighth transistor;

a gate of the eighth transistor is connected to a second control signal line, and a drain of the eighth transistor is connected to the initialization module and the source of the fourth transistor;

a gate of the sixth transistor is connected to the source of the eighth transistor, a source of the sixth transistor is connected to the data voltage writing module and the drain of the seventh transistor, and a drain of the sixth transistor is connected to a source of the tenth transistor;

a gate of the tenth transistor is connected to the light-emitting control signal line, and a drain of the tenth transistor is connected to the second light emitting diode; and an anode of the second light emitting diode is connected to the drain of the tenth transistor, and an cathode of the second light emitting diode is connected to the low voltage level signal line.

8. The pixel circuit of claim 7, wherein the initialization module comprises a third transistor having a gate connected to a reset signal line, a source connected to the source of the fourth transistor in the first threshold compensation module of the first pixel sub-circuit and the drain of the eighth transistor in the second threshold compensation module of the second pixel sub-circuit, and a drain connected to the low voltage level signal line.

9. The pixel circuit of claim 8, wherein the data voltage writing module comprises a first transistor having a gate connected to the gate signal control line, a source connected to the data signal line, and a drain connected to the source of the fifth transistor in the first driving module of the first pixel sub-circuit and the source of the sixth transistor in the second driving module of the second pixel sub-circuit.

10. The pixel circuit of claim 9, wherein the data voltage input into the data voltage writing module comprises a first data voltage and a second data voltage, the first data voltage is configured to drive the first threshold compensation module to perform threshold voltage compensation for the first driving module, and the second data voltage is configured to drive the second threshold compensation module to perform threshold voltage compensation for the second driving module.

11. The pixel circuit of claim 7, both the first light emitting diode and the second light emitting diode are organic light emitting diodes.

12. The pixel circuit of claim 9, wherein the transistors are all P-type thin film transistors.

13. A display comprising a plurality of pixels, a plurality of data signal lines and a plurality of gate control signal lines, wherein every two pixels constitute one pixel unit, and the display also comprises the pixel circuit according to claim 1 connected to each pixel unit.

14. The display of claim 13, wherein every two pixels arranged in the horizontal direction constitute one pixel unit, and the two pixels in each of the pixel units share one data signal line.

15. The display of claim 13, wherein every two pixels arranged in the vertical direction constitute one pixel unit, and the two pixels in each of the pixel units share one gate control signal line.

16. The display of claim 14, wherein the first pixel sub-circuit comprises the first driving module, a first light-emitting module, a first threshold compensation module and a first light-emitting control module, the first threshold compensation module is connected to the initialization module and performs initialization under the control of an initialization signal output by the initialization module;

the first threshold compensation module is connected to the first driving module, and is configured to perform threshold voltage compensation for the first driving module; and the first light-emitting module is connected to the first light-emitting control module, and is configured to perform light-emitting display under the effect of the first driving module and the first light-emitting control module.

17. The display of claim 16, wherein the first threshold compensation module comprises a first storage capacitor, a second transistor and a fourth transistor; the first driving module comprises a fifth transistor; the first light-emitting control module comprises a seventh transistor and a ninth transistor; and the first light-emitting module comprises a first light emitting diode;

one terminal of the first storage capacitor is connected to a high voltage level signal line, and the other terminal is connected to a source of the second transistor;

wherein a gate of the second transistor is connected to a first control signal line, and a drain of the second transistor is connected to the initialization module and a source of the fourth transistor;

a gate of the fourth transistor is connected to the gate signal terminal, and the source of the fourth transistor is connected to the initialization module;

a gate of the fifth transistor is connected to the initialization module and the source of the fourth transistor, a drain of the fifth transistor is connected to a drain of the fourth transistor, and a source of the fifth transistor is connected to the data voltage writing module;

a gate of the seventh transistor is connected to a light-emitting control signal line, a source of the seventh transistor is connected to the high voltage level signal line, and a drain of the seventh transistor is connected to the source of the fifth transistor;

a gate of the ninth transistor is connected to the light-emitting control signal line, a source of the ninth transistor is connected to the drain of the fifth transistor, and a drain of the ninth transistor is connected to the first light emitting diode; and an anode of the first light emitting diode is connected to the drain of the ninth transistor, and an cathode of the first light emitting diode is connected to a low voltage level signal line.

18. The display of claim 17, wherein the second pixel sub-circuit comprises the second driving module, a second light-emitting module, a second threshold compensation module and a second light-emitting control module, the second threshold compensation module is connected to the initialization module and performs initialization under the control of the initialization signal output by the initialization module;

the second threshold compensation module is connected to the second driving module, and is configured to perform threshold voltage compensation for the second driving module; and the second light-emitting module is connected to the second light-emitting control module, and is configured to perform light-emitting display under the effect of the second driving module and the second light-emitting control module.

19. The display of claim 18, wherein the second threshold compensation module comprises a second storage capacitor and an eighth transistor; the second driving module comprises a sixth transistor; the second light-emitting control module comprises a tenth transistor; and the second light-emitting module comprises a second light emitting diode;

wherein one terminal of the second storage capacitor is connected to the high voltage level signal line, and the other terminal is connected to a source of the eighth transistor;

a gate of the eighth transistor is connected to a second control signal line, and a drain of the eighth transistor is connected to the initialization module and the source of the fourth transistor;

a gate of the sixth transistor is connected to the source of the eighth transistor, a source of the sixth transistor is connected to the data voltage writing module and the drain of the seventh transistor, and a drain of the sixth transistor is connected to a source of the tenth transistor;

a gate of the tenth transistor is connected to the light-emitting control signal line, and a drain of the tenth transistor is connected to the second light emitting diode; and an anode of the second light emitting diode is connected to the drain of the tenth transistor, and an cathode of the second light emitting diode is connected to the low voltage level signal line.

20. The display of claim 19, wherein the initialization module comprises a third transistor having a gate connected to a reset signal line, a source connected to the source of the fourth transistor in the first threshold compensation module of the first pixel sub-circuit and the drain of the eighth transistor in the second threshold compensation module of the second pixel sub-circuit, and a drain connected to the low voltage level signal line;

the data voltage writing module comprises a first transistor having a gate connected to the gate signal control line, a source connected to the data signal line, and a drain connected to the source of the fifth transistor in the first driving module of the first pixel sub-circuit and the source of the sixth transistor in the second driving module of the second pixel sub-circuit;

the data voltage input into the data voltage writing module comprises a first data voltage and a second data voltage, the first data voltage is configured to drive the first threshold compensation module to perform threshold voltage compensation for the first driving module, and the second data voltage is configured to drive the second threshold compensation module to perform threshold voltage compensation for the second driving module.

* * * * *